(12) United States Patent
Lee

(10) Patent No.: US 11,646,080 B2
(45) Date of Patent: May 9, 2023

(54) MEMORY DEVICE HAVING WORD LINE GROUPS AND OPERATING METHOD OF THE MEMORY DEVICE

(71) Applicant: SK hynix Inc., Icheon-si Gyeonggi-do (KR)

(72) Inventor: Hee Youl Lee, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 16/897,891

(22) Filed: Jun. 10, 2020

(65) Prior Publication Data

US 2021/0134367 A1 May 6, 2021

(30) Foreign Application Priority Data

Nov. 5, 2019 (KR) ........................ 10-2019-0140428

(51) Int. Cl.
| | |
|---|---|
| *G11C 16/08* | (2006.01) |
| *G11C 16/14* | (2006.01) |
| *G11C 16/30* | (2006.01) |
| *G11C 29/12* | (2006.01) |
| *G11C 16/28* | (2006.01) |
| *G11C 29/44* | (2006.01) |

(52) U.S. Cl.
CPC ............... *G11C 16/08* (2013.01); *G11C 16/14* (2013.01); *G11C 16/28* (2013.01); *G11C 16/30* (2013.01); *G11C 29/12* (2013.01); *G11C 2029/1202* (2013.01); *G11C 2029/4402* (2013.01)

(58) Field of Classification Search
CPC ......... G11C 16/08; G11C 16/14; G11C 16/28; G11C 16/30; G11C 29/12
See application file for complete search history.

(56) References Cited

U.S. PATENT DOCUMENTS

| | | | | |
|---|---|---|---|---|
| 9,390,803 | B2 * | 7/2016 | Shim .................. | G11C 16/0483 |
| 9,576,671 | B2 * | 2/2017 | Karakulak .......... | G11C 16/3495 |
| 9,589,647 | B1 * | 3/2017 | Ahn ..................... | G11C 16/08 |
| 9,905,302 | B2 * | 2/2018 | Karakulak ............ | G11C 16/26 |
| 10,289,341 | B2 * | 5/2019 | Kirshenbaum ....... | G06F 3/0616 |
| 10,541,033 | B2 * | 1/2020 | Jung ..................... | G11C 16/20 |
| 10,573,397 | B1 * | 2/2020 | Sehgal ................ | G11C 11/5628 |
| 10,839,923 | B1 * | 11/2020 | Yang ..................... | G11C 16/30 |

FOREIGN PATENT DOCUMENTS

| | | |
|---|---|---|
| KR | 1020180060370 A | 6/2018 |
| KR | 1020190001624 A | 1/2019 |

* cited by examiner

*Primary Examiner* — Vanthu T Nguyen
(74) *Attorney, Agent, or Firm* — William Park & Associates Ltd.

(57) ABSTRACT

A memory device includes word lines vertically stacked from a substrate, memory cells electrically connected to the word lines, a group controller configured to group the word lines into word line groups, and change the word line groups, based on electrical characteristics of the memory cells, and a voltage generator configured to store, in a voltage table, voltage values of operating voltages to be respectively applied to the word line groups.

19 Claims, 12 Drawing Sheets

MEMORY DEVICE HAVING WORD LINE GROUPS AND OPERATING METHOD OF THE MEMORY DEVICE

CROSS-REFERENCE TO RELATED APPLICATION

The present application claims priority under 35 U.S.C. § 119(a) to Korean patent application number 10-2019-0140428 filed on Nov. 5, 2019, the entire disclosure of which is incorporated herein by reference.

BACKGROUND

1. Technical Field

The present disclosure generally relates to a memory device and an operating method thereof, and more particularly, to a memory device having a three-dimensional structure and an operating method thereof.

2. Related Art

A memory device may store data and output stored data. A memory device may be configured as a volatile memory device in which stored data is lost when a supply of power is interrupted, or be configured as a nonvolatile memory device in which stored data is retained even when the supply of power is interrupted. The memory device may include a memory cell array configured to store data; a peripheral circuit configured to perform various operations, such as program, read, and erase operations; and control logic configured to control the peripheral circuit.

The nonvolatile memory device may be implemented in a two-dimensional (2D) structure in which memory cells are arranged in parallel to a substrate or a three-dimensional structure in which memory cells are stacked in a vertical direction over a substrate.

In the case of a memory device having a 3D structure, because memory cells are stacked in a vertical direction above the substrate, word lines connected to the memory cells may also be stacked to be spaced apart from each other. However, an electrical difference between the memory cells stacked to be spaced apart from each other may occur due to a characteristic of a manufacturing process.

SUMMARY

In accordance with an aspect of the present disclosure, a memory device includes: word lines vertically stacked from a substrate; memory cells electrically connected to the word lines; a group controller configured to group the word lines into word line groups, and change the word line groups, based on electrical characteristics of the memory cells; and a voltage generator configured to store, in a voltage table, voltage values of operating voltages to be respectively applied to the word line groups.

In accordance with another aspect of the present disclosure, a method for operating a memory device includes: dividing word lines into a plurality of groups; setting voltages corresponding to each of the groups to a default value; changing the groups depending on electrical characteristics of memory cells, after the default value is set; and changing the default value to a final voltage value depending on the changed groups.

In accordance with still another aspect of the present disclosure, a method for operating a memory device includes: setting a boundary region for memory cells, and dividing the memory cells into first and second groups, based on the boundary region; testing electrical characteristics of some memory cells adjacent to the boundary region; and resetting the first and second groups by changing a position of the boundary region, based on the test result.

BRIEF DESCRIPTION OF THE DRAWINGS

Example embodiments will be described hereinafter with reference to the accompanying drawings; however, they may be embodied in different forms and should not be construed as being limited to the specific embodiments set forth herein. Rather, presented embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
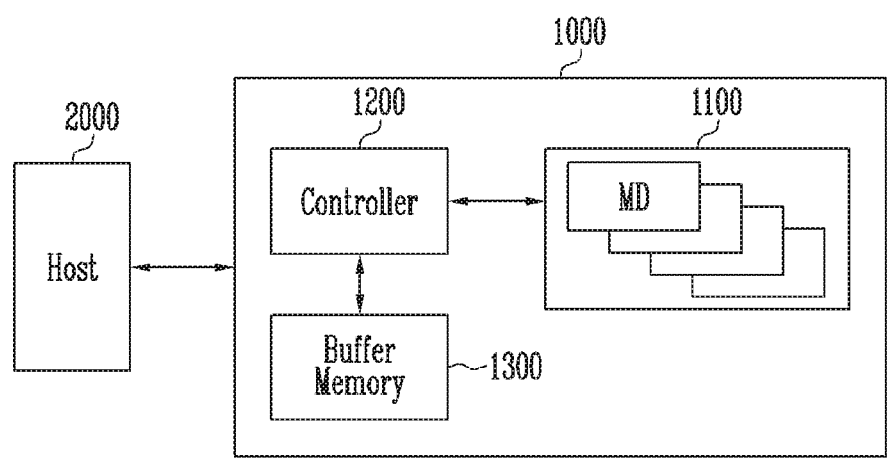
FIG. 1 is a diagram illustrating a memory system in accordance with an embodiment of the present disclosure.

FIG. 1 is a diagram illustrating a memory system 1000 in accordance with an embodiment of the present disclosure.

Referring to FIG. 1, the memory system 1000 may include a storage device 1100 configured to store data and a controller 1200 configured to communicate between the storage device 1100 and a host 2000.

The storage device 1100 may include a plurality of memory devices MD. For example, the memory devices MD may be implemented with a volatile memory device in which stored data disappears when the supply of power is interrupted or a nonvolatile memory device in which stored data is retained even when the supply of power is interrupted. In the following embodiment, the memory devices MD implemented with the nonvolatile memory device are illustrated as an example. The nonvolatile memory device may be a NAND flash memory device. The memory devices MD may communicate with the controller 1200 through a plurality of channels.

The controller 1200 may communicate between the host 2000 and the storage device 1100. The controller 1200 may control the storage device 1100 in response to a request RQ from the host 2000, or perform a background operation for improving performance of the memory system 1000 even when there is no request from the host 2000. Also, in a test mode, the controller 1200 may transmit commands for test to the memory devices MD included in the storage device 1100, and the memory devices MD may perform a program operation for a test, a read operation for a test, an erase operation for a test, and the like in response to a command for a test.

The host 2000 may generate requests RQ for various operations, and output the generated requests RQ to the memory system 1000. For example, the requests RQ may include a program request for a program operation, a read request for a read operation, an erase request for an erase operation, and the like. The host 2000 may communicate with the memory system 1000 through various interfaces such as Peripheral Component Interconnect-Express (PCI-E), Advanced Technology Attachment (ATA), Serial ATA (SATA), Parallel ATA (PATA), Serial Attached SCSI (SAS), or Non-Volatile Memory Express (NVMe), a Universal Serial Bus (USB), a Multi-Media Card (MMC), an Enhanced Small Disk Interface (ESDI), and Integrated Drive Electronics (IDE).

Figure 2:
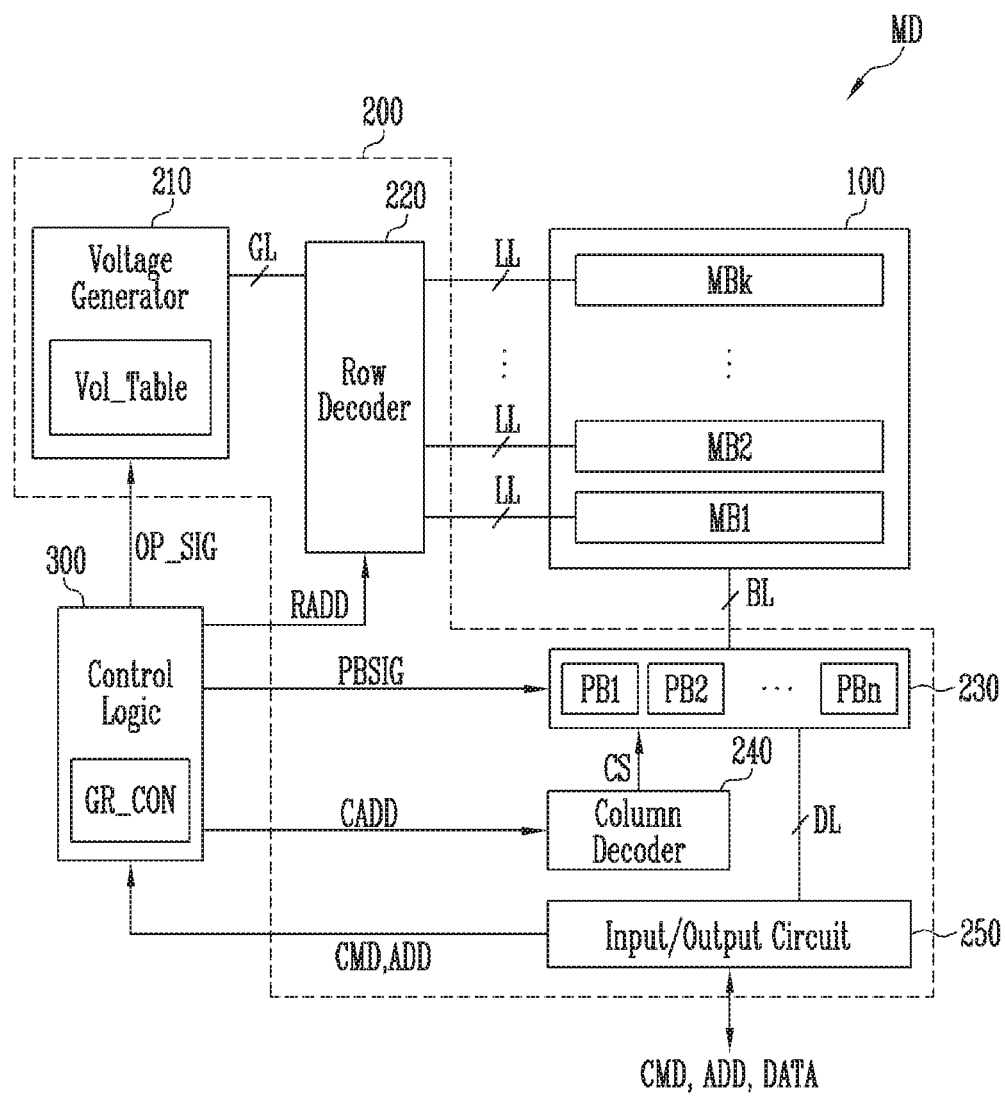
FIG. 2 is a diagram illustrating a memory device shown in FIG. 1.

FIG. 2 is a diagram illustrating the memory device MD shown in FIG. 1.

Referring to FIG. 2, the memory device MD may include a memory cell array 100 configured to store data, a peripheral circuit 200 configured to perform a program operation, a read operation, an erase operation, and the like, and control logic 300 configured to control the peripheral circuit 200.

The memory cell array 100 may include a plurality of memory blocks MB1 to MBk (k is a positive integer). The memory blocks MB1 to MBk may be configured in a three-dimensional structure. For example, the memory block having the three-dimensional structure may include memory cells stacked in a vertical direction from a substrate. The memory blocks MB1 to MBk may be configured in the same structure, and be connected to the peripheral circuit 200 through bit lines BL and local lines LL.

The peripheral circuit 200 may perform a program operation, a read operation, an erase operation, and the like in response to control signals OP_SIG and PBSIG and addresses RADD and CADD, which are output from the control logic 300. In order to perform these operations, the peripheral circuit 200 may include a voltage generator 210, a row decoder 220, a page buffer group 230, a column decoder 240, and an input/output circuit 250.

The voltage generator 210 may generate various operating voltages in response to an operating signal OP_SIG, and transmit the generated operating voltages to the row decoder 220 through global lines GL. For example, the voltage generator 210 may generate operating voltages including a program voltage, a program verify voltage, a pass voltage, a read voltage, an erase voltage, an erase pass voltage, and the like.

The voltage generator 210 may include a voltage table Vol_Table for storing voltage values respectively set in word line groups. For example, a voltage default value of each of the word line groups may be stored in the voltage table Vol_Table. When the word line groups are changed in a test phase of the memory device, the default value stored in the voltage table Vol_Table may be changed to a final voltage value changed based on the changed word line groups. In other words, when the word line groups are not changed in the test phase, the default value stored in the voltage table Vol_Table is maintained. When the word line groups are changed in the test phase, the default value stored in the voltage table Vol_Table may be changed to the final voltage value.

The voltage value stored in the voltage table Vol_Table may be used when the voltage generator 210 generates a voltage. For example, the voltage generator 210 may generate voltages necessary for a program, read or erase operation in response to the operating signal OP_SIG. The voltage generator 210 may generate voltages to be applied to the global lines GL according to the voltage value stored in the voltage table Vol_Table. For example, the voltage generator 210 may apply a first operating voltage to lines corresponding to a first word line group among the global lines GL, and apply a second operating voltage different from the first operating voltage to lines corresponding to a second word line group among the global lines GL. The voltage value stored in the voltage generator 210 may be stored as a code configured with a plurality of bits, and the voltage generator 210 may generate various operating voltages according to various codes stored in the voltage table Vol_Table.

The row decoder 220 may select a memory block according to a row address RADD, and transmit operating voltages applied to the global lines GL to the selected memory block through the local lines LL.

The page buffer group 230 may be connected to the memory blocks MB1 to MBk through the bit lines BL, and include a plurality of page buffers PB1 to PBn respectively connected to the bit lines BL. The page buffer group 230 may control voltages of the bit lines BL or sense voltages or currents of the bit lines BL, in response to page control signals PBSIG.

The column decoder 240 may output column select signals CS such that the page buffer group 230 and the input/output circuit 250 can exchange data with each other, in response to a column address CADD. For example, when the input/output circuit 250 loads data to data lines DL, the column decoder 240 may control the page buffer group 230 such that the data loaded to the data lines DL are sequentially input to the page buffers PB1 to PBn, by sequentially outputting the column select signals CS. Also, the column decoder 240 may output the column select signals CS to sequentially transmit the data stored in the page buffers PB1 to PBk to the input/output circuit 250.

The input/output circuit 250 may receive a command CMD, an address ADD, and data DATA from the controller (1200 shown in FIG. 1), transmit the command CMD and the address ADD to the control logic 300, and transmit the data DATA to the page buffer group 230 through the data lines DL. Also, the input/output circuit 250 may output the data DATA received through the data lines DL to the controller 1200.

The control logic 300 may output the operating signals OP_SIG and the page control signals PBSIG in response to the command CMD, and output the row address RADD and the column address CADD in response to the address ADD. The control logic 130 may be implemented as hardware, software, or a combination of hardware and software. For example, the control logic 130 may be a control logic circuit operating in accordance with an algorithm and/or a processor executing control logic code.

The control logic 300 may include a group controller GR_CON configured to control an operation for setting or resetting a group of word lines. The group controller GR_CON may control a test operation of the memory device MD. For example, in a test operation of the memory device MD, the group controller GR_CON may reset a boundary region defining groups of the word lines, based on a test result value of the memory cells, and control the voltage table Vol_Table such that the default value of the voltage table Vol_Table is stored as the final voltage value according to the reset boundary region.

Also, the control logic 300 may output operating signals OP_SIG for a program operation to the word lines in response to a program command. The voltage generator 210 may generate operating voltages used for the program operation in response to the operating signals OP_SIG for the program operation. The voltage generator 210 may generate operating voltages having various levels, which are to be transmitted to each of the word line groups, based on the value stored in the voltage table Vol_Table.

Figure 3:
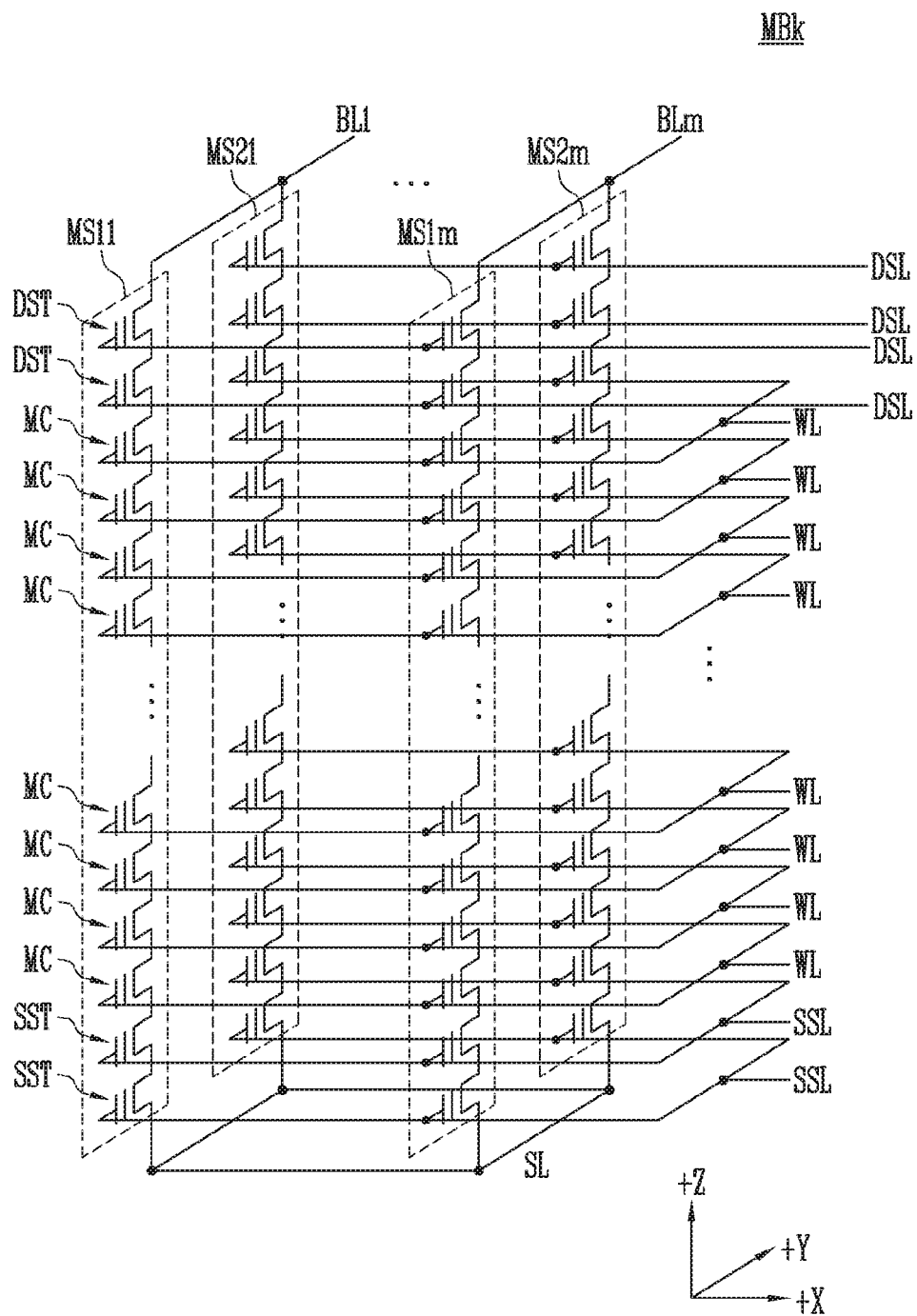
FIG. 3 is a circuit diagram illustrating an embodiment of a memory block shown in FIG. 2.

FIG. 3 is a circuit diagram illustrating an embodiment of the memory block MBk shown in FIG. 2.

Referring to FIG. 3, the memory block MBk may include a plurality of memory strings MS11 to MS1m and MS21 to MS2m connected between bit lines BL1 to BLm and a source line SL. Each of the memory strings MS11 to MS1m and MS21 to MS2m may extend along a +Z direction. The +Z direction may be a direction in which memory cells MC are stacked, and be a direction vertical to a substrate. Here, m is an integer of 2 or more.

Each of the memory strings MS11 to MS1m and MS21 to MS2m may include at least one source select transistor SST, a plurality of memory cells MC, and at least one drain select transistor DST, which are connected in series.

Source select transistors SST included in one memory string (any one of MS11 to MS1m and MS21 to MS2m) may be connected in series between the memory cells MC and the source line SL. Gate electrodes of the source select transistors SST are connected to source select lines SSL. In addition, source select transistors SST located at the same level may be connected to the same source select line SSL.

Memory cells MC included in one memory string (any one of MS11 to MS1m and MS21 to MS2m) may be connected in series between at least one source select transistor SST and at least one drain select transistor DST. Gate electrodes of the memory cells MC are connected to word lines WL. Operating voltages (a program voltage, a pass voltage, a read voltage, and the like) used for driving may be applied to each of the word lines WL. In addition, memory cells located at the same level may be connected to the same word line WL.

Drain select transistors DST included in one memory string (any one of MS11 to MS1m and MS21 to MS2m) may be connected in series between the bit lines BL1 to BLm and the memory cells MC. Gate electrodes of the drain select transistors DST are connected to drain select lines DSL. Drain select transistors DST located at the same level among drain select transistors DST of the memory strings MS11 to MS1m and MS21 to MS2m, which are arranged on the same row (+X direction), may be connected to the same drain select line DSL, In addition, drain select transistors DST arranged on different rows (+X direction) may be connected to different drain select lines DSL.

Figure 4:
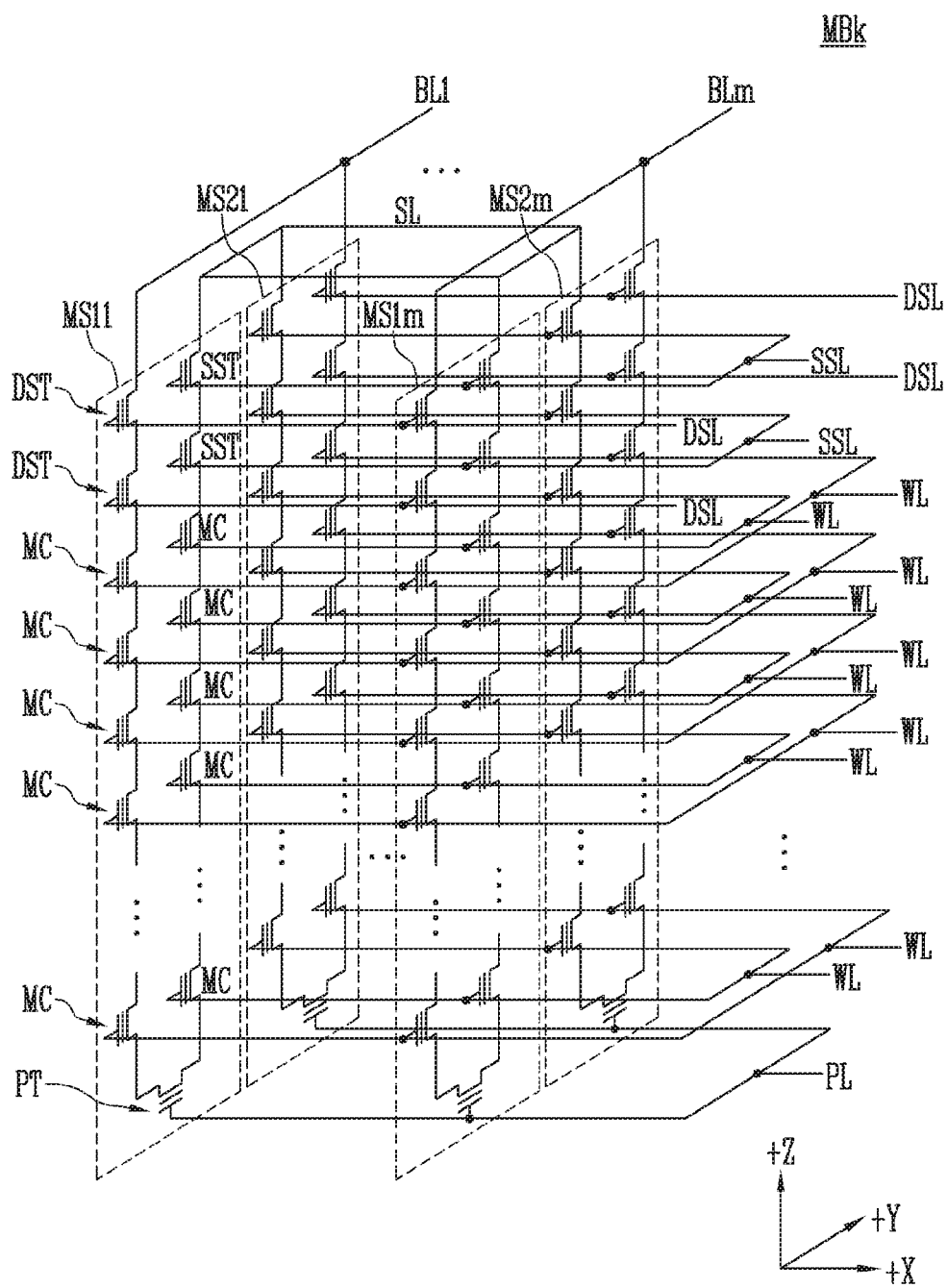
FIG. 4 is a circuit diagram illustrating another embodiment of the memory block shown in FIG. 2.

FIG. 4 is a circuit diagram illustrating another embodiment of the memory block MBk shown in FIG. 2.

Referring to FIG. 4, the memory block MBk may include a plurality of memory strings MS11 to MS1m and MS21 to MS2m. Each of the memory strings MS11 to MS1m and MS21 to MS2m may include at least one source select transistor SST, a plurality of memory cells MC, at least one pipe transistor PT, a plurality of memory cells MC, and at least one drain select transistor DST, which are connected in series. Each of the memory strings MS11 to MS1m and MS21 to MS2m may be arranged in a shape.

The pipe transistor PT may connect drain-side memory cells MC and source-side memory cells MC. In addition, a gate of the pipe transistor PT of each of the memory strings MS11 to MS1m and MS21 to MS2m may be connected to a pipe line PL.

The other components of the memory strings MS11 to MS1m and MS21 to MS2m except the above-described components are similar to those described with reference to FIG. 3, and therefore, repeated descriptions will be omitted.

Figure 5:
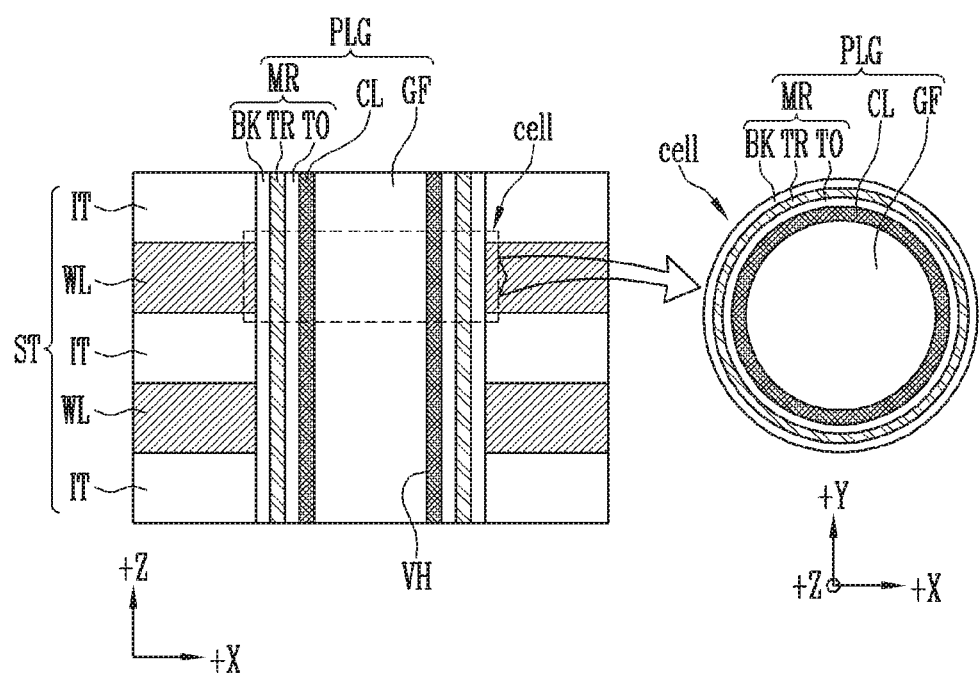
FIG. 5 is a diagram illustrating a memory cell included in a memory block having a three-dimensional structure.

FIG. 5 is a diagram illustrating a memory cell included in a memory block having a three-dimensional structure.

Referring to FIG. 5, the memory block may be formed in a stack structure ST including a plurality of word lines WL and interlayer insulating layers IT, which are stacked in a direction (+Z) vertical to a substrate, and a plug PLG vertically penetrating the word lines WL and the interlayer insulating layers IT. The word lines WL and the interlayer insulating layers IT may be alternately stacked. The word lines WL may be formed of a conductive material, and the interlayer insulating layers IT may be formed of an insulating material.

The plug PLG may include a gap fill layer GF, a channel layer CL, and a memory layer MR, which are formed in a vertical hole VH vertically penetrating the word lines WL and the interlayer insulating layers IT. The gap fill layer GF may be formed in a circular pillar shape extending in the vertical direction (+Z) at the center of the vertical hole VH. The channel layer CL may be formed in a cylindrical shape surrounding a sidewall of the gap fill layer GF, and the memory layer MR may be formed in a cylindrical shape surrounding a sidewall of a channel layer CL. The gap fill layer GF may be formed of an insulating material, and the channel layer CL may be formed of a poly-silicon. Alternatively, instead of the gap fill layer GF, the channel layer CL may be formed in a circular pillar shape at the center of the vertical hole VH. In this embodiment described below, the plug PLG in which the gap fill layer GF is formed at the center of the vertical hole VH is described as an example.

The memory layer MR may include a tunnel insulating layer TO having a cylindrical shape, which surrounds the sidewall of the channel layer CL; a charge trap layer TR having a cylindrical shape, which surrounds a sidewall of the tunnel insulating layer TO; and a blocking layer BK having a cylindrical shape, which surrounds a sidewall of the charge trap layer TR. The tunnel insulating layer TO may be formed of an oxide layer as an insulating material, the charge trap layer TR may be formed of a nitride layer, and the blocking layer BK may be formed of an oxide layer as an insulating material. The tunnel insulating layer TO is a layer in which electrons tunnel between the channel layer CL and the charge trap layer TR, the charge trap layer TR is a layer in which electrons are trapped, and the blocking layer BK is a layer for blocking movement of electrons trapped in the charge trap layer TR to the word line WL.

A memory cell includes a plug adjacent to a word line in the stack structure ST, and a width of the memory cell is defined by each component constituting the plug PLG.

For example, the plug PLG is formed inside the vertical hole VH vertically penetrating the word lines WL and the interlayer insulating layers IT, and therefore, a width of the plug PLG is determined according to a width of the vertical hole VH.

In one embodiment, the width of the vertical hole VH is to be the same regardless of the position of the vertical hole VH. However, the width of the vertical hole VH may be differently formed depending on a height of the stack structure ST due to a characteristic of a manufacturing process. Therefore, because widths of memory cells may also be differently formed depending on heights of the memory cells, operating voltages may be differently set depending on structures of the memory cells in this embodiment. The structures of the memory cells may correspond to the widths of the memory cells. In addition, although the structures of the memory cells are similar to one another, an electrical difference between the memory cell and the word line WL may exist due to characteristics of a material constituting the memory cell or the word line WL. In this embodiment, the word lines WL may be grouped according to the structures of the memory cells, groups of the word lines WL may be flexibly changed depending on electrical characteristics of the memory cells, and operating voltages may be differently set depending on the changed groups. This will be described in detail as follows.

FIGS. 6 to 9 are diagrams illustrating a memory block having a single stack structure and a voltage setting method in accordance with a first embodiment of the present disclosure.

Figure 6:
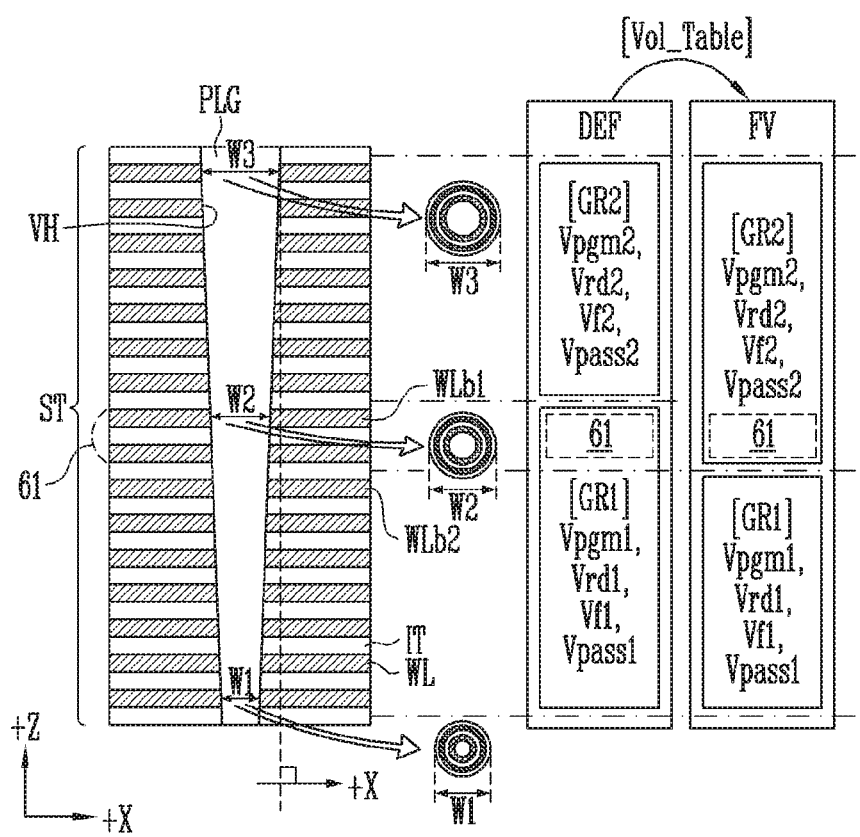
FIGS. 6 to 9 are diagrams illustrating a memory block having a single stack structure and a voltage setting method in accordance with a first embodiment of the present disclosure.

FIG. 6 is a diagram briefly illustrating a group changing and voltage setting method in accordance with the first embodiment of the present disclosure.

Referring to FIG. 6, the single stack structure ST is a structure in which a vertical hole VH vertically penetrating word lines WL and interlayer insulating layers IT, which are stacked, is formed through a one-time etching process. Due to the etching process, the vertical hole VH may be formed to have an upper width wider than a lower width. That is, the slope of a sidewall of the vertical hole VH might not be vertical to a substrate, and may have a curved surface. For example, when the width of a lowermost portion of the vertical hole VH is a first width W1, the width of an intermediate height of the vertical hole VH may be a second width W2 wider than the first width W1, and the width of an uppermost portion of the vertical hole VH may be a third width W3 wider than the second width W2.

Therefore, widths of memory cells included in a plug PLG may be different depending on positions of the plug PLG. For example, a memory cell formed at a lowermost portion of the plug PLG may have the first width W1, a memory cell formed at an intermediate height of the plug PLG may have the second width W2, and a memory cells formed at an uppermost portion of the plug PLG may have the third width W3.

Therefore, the word lines WL included in the single stack structure ST may be divided into a plurality of groups according to structures of the memory cells. For example, the word lines WL may be divided into a first group GR1 in which memory cells have narrow widths and a second group GR2 in which memory cells have wide widths. For example, word lines WL formed in a lower region including a first boundary word line WLb1 formed at the center of a memory string may be included in the first group GR1, and word lines WL formed in an upper region of the first boundary word line WLb1 may be included in the second group GR2.

A default value DEF may be stored in the voltage table Vol_Table such that different voltages are applied to the first and second groups GR1 and GR2 divided according to the structures of the memory cells. For example, in a program or read operation, a voltage applied to a selected word line and a voltage applied to unselected word lines may be differently set depending on the first and second groups GR1 and GR2. For example, when a selected word line is included in the first group GR1, a first program voltage Vpgm1, a first read voltage Vrd1, or a first verify voltage Vf1 may be applied to the selected word line, a first pass voltage Vpass1 may be applied to unselected word lines included in the first group GR1, and a second pass voltage Vpass2 may be applied to unselected word lines included in the second group GR2. When a selected word line is included in the second group, a second program voltage Vpgm2, a second read voltage Vrd2, or a second verify voltage Vf2 may be applied to the selected word line, the first pass voltage Vpass1 may be applied to unselected word lines included in the first group GR1, and the second pass voltage Vpass2 may be applied to unselected word lines included in the second group GR2. The second program voltage Vpgm2 may be set to a level different from that of the first program voltage Vpgm1, and the second read voltage Vrd2 may be set a level different from that of the first read voltage Vrd1. The other voltages Vf1, Vpass1, Vf2, and Vpass2 may be differently set in the first group GR1 and the second group GR2.

As described above, the default value DEF may be a voltage set with respect to the first and second groups GR1 and GR2 divided according to the structures of the memory cells. Therefore, the default value DEF may be stored in the voltage table Vol_Table until before a test operation of the memory device.

Among memory cells adjacent to a boundary of the first and second groups GR1 and GR2, there may exist memory cells which are included in different groups but have similar electrical characteristics. That is, among memory cells which are included in the first group GR1 and are adjacent to the first boundary word line WLb1, there may exist memory cells which have an electrical characteristic, such as a program speed or an erase speed, more similar to that of the memory cells included in the second group GR2 than that of the memory cells included in the first group GR1. Alternatively, there may exist memory cells which have an electrical characteristic more similar to that of some memory cells of the second group GR2 than that of the memory cells of the first group GR1. In this embodiment, when these memory cells are detected, word lines included in the first and second groups GR1 and GR2 are changed, and the default value DEF is changed to a final voltage value FV according to the changed word lines, so that the reliability of the memory device can be improved.

For example, the default value DEF is set to a voltage applied to the word lines of the first and second groups GR1 and GR2 divided with respect to the first boundary word line WLb1. The final voltage value FV may be set to a voltage applied to word lines of the first and second groups GR1 and GR2 reorganized with respect to word lines connected to memory cells having similar electrical characteristics through a test operation of the memory device in a state in which the default value DEF is set. More specifically, when it is determined that an electrical characteristic of some memory cells 61 adjacent to the first boundary word line WLb1 among the memory cells included in the first group GR1 is more similar to that of the second group GR2 than that of the first group GR1, as a result of the test operation of the memory device, after the default value DEF is set, the memory cells 61 may be included in the second group GR2, the first boundary word line WLb1 with respect to which the first and second groups GR1 and GR2 are divided may be changed to a second boundary word line WLb2. Therefore, the group controller (GR_CON shown in FIG. 2) may change the first and second groups GR1 and GR2 and voltage values set in each group in the voltage table (Vol_Table shown in FIG. 2) such that voltages applied to word lines connected to the memory cells 61 are set to have the same level as the second group GR2. When it is unnecessary to change the first and second groups GR1 and GR2, as a result of the test operation of the memory device, the group controller (GR_CON shown in FIG. 2) may maintain the default value DEF of the voltage table (Vol_Table shown in FIG. 2).

A boundary or reference with respect to how the first and second groups GR1 and GR2 are divided may be set to a word line located at an uppermost end in the first group GR1, set to a word line located at a lowermost end in the second group GR2, or set to a region in the interlayer insulating layer IT is formed between adjacent word lines in the first and second groups GR1 and GR2.

A boundary region with respect to how the first and second groups GR1 and GR2 are divided may be flexibly changed through a test operation of some memory cells included between the first and second groups GR1 and GR2. This will be described in detail as follows with reference to FIG. 7.

Figure 7:
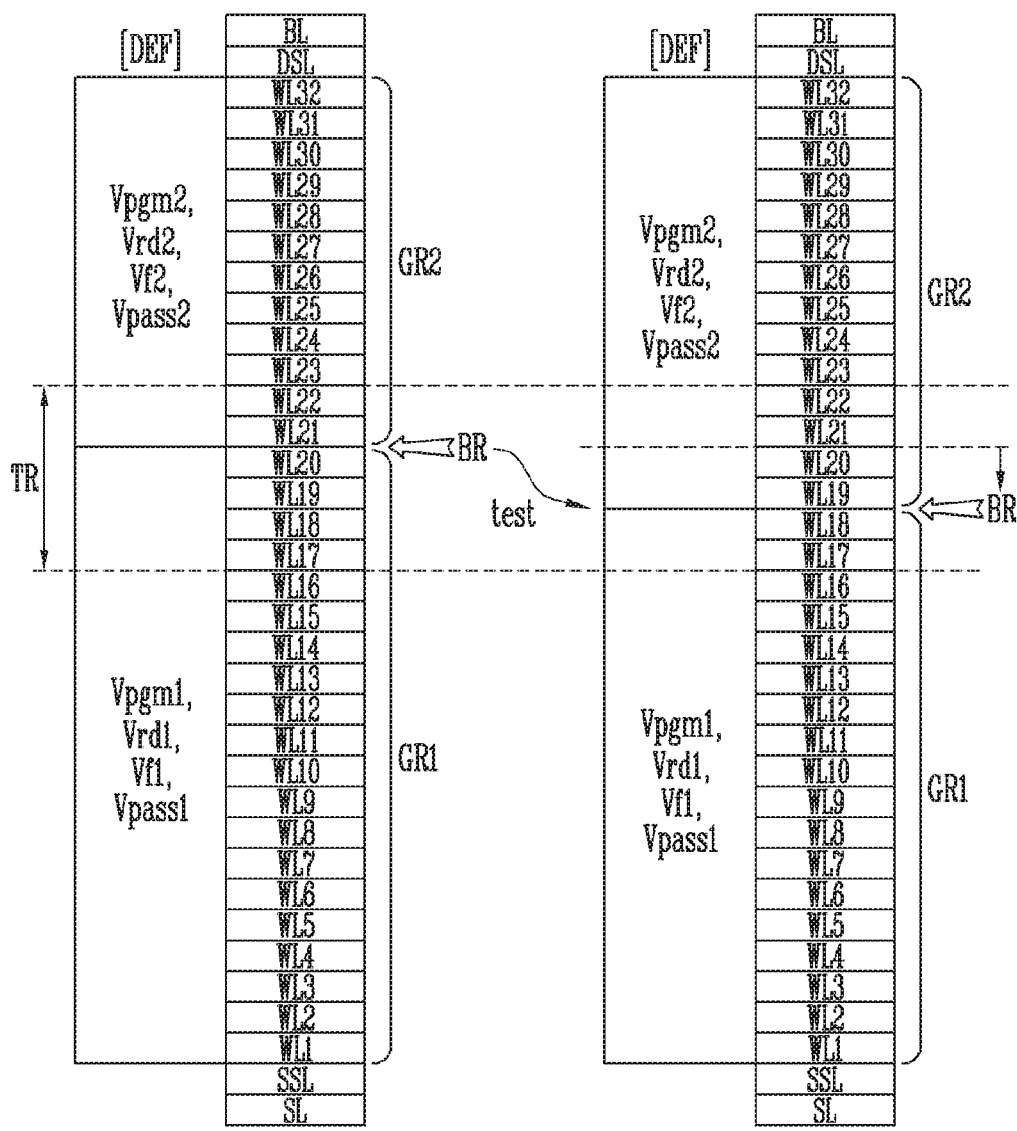

FIG. 7 is a diagram illustrating an embodiment in which the boundary region is changed.

Referring to FIG. 7, when first to twentieth word lines WL1 to WL20 are included in a first group GR1, and twenty-first to thirty-second word lines WL21 to WL32 are included in a second group GR2, based on structures of memory cells, a boundary region BR of the first and second groups GR1 and GR2, which is initially set, becomes a region between the twentieth and twenty-first word lines WL20 and WL21. A voltage set in each of the first and second groups GR1 and GR2 divided with respect to the boundary region BR becomes a default value DEF. In the default value DEF, a first program voltage Vpagm1, a first read voltage Vrd1, a first verify voltage Vf1, and a first pass voltage Vpass1, which correspond to the first group GR1, may be set as voltages to be applied to the first to twentieth word lines WL1 to WL20, and a second program voltage Vpgm2, a second read voltage Vrd2, a second verify voltage Vf2, and a second pass voltage Vpass2, which correspond to the second group GR2, may be set as voltages to be applied to the twenty-first to thirty-second word lines WL21 to WL32.

The default value DEF is a voltage set with respect to word lines of the first and second groups GR1 and GR2 divided according to the structures of the memory cells. Therefore, in this embodiment, the boundary region BR set according to the structures of the memory cells may be changed to another boundary region BR according to electrical characteristics of the memory cells.

For example, a test operation of the memory cells may be performed, and the boundary region BR may be changed such that word lines connected to memory cells having similar electrical characteristics are included in the same group, based on a result value of the test operation. When the boundary region BR is changed, the first and second groups GR1 and GR2 are also changed, and therefore, the default value DEF may be changed to a final voltage value FV, based on word lines of the changed first and second groups GR1 and GR2.

For example, as a result of the test operation, when it is determined that an electrical characteristic of memory cells connected to the nineteenth and twentieth word lines WL19 and WL20 included in the first group GR1 is similar to that of memory cells connected to the twenty-first or twenty-second word line WL21 or WL22 included in the second group GR2, the boundary region BR is changed, and the first and second groups GR1 and GR2 are also changed. Therefore, in a reset final voltage value FV, the first program voltage Vpgm1, the first read voltage Vrd1, the first verify voltage Vf1, and the first pass voltage Vpass1, which correspond to the first group GR1, may be reset as voltages to be applied to the first to eighteenth word lines WL1 to WL18, and the second program voltage Vpgm2, the second read voltage Vrd2, the second verify voltage Vf2, and the second pass voltage Vpass2, which correspond to the second group GR2, may be reset as voltages to be applied to the nineteenth to thirty-second word lines WL19 to WL32.

The test operation may be performed on memory cells connected to some word lines adjacent to the boundary region BR. In other words, when the test operation is performed on the memory cells connected to all the word lines, a time required to perform the test operation is increased, and therefore, the test operation may be performed on only memory cells connected to some word lines adjacent to the boundary region BR so as to reduce the time. For example, the test operation may be performed on memory cells included in the test region TR. Therefore, the boundary region BR may be flexibly changed in the test region TR, based on a result of the test operation.

The test operation will be described in detail as follows with reference to FIG. 8.

Figure 8:
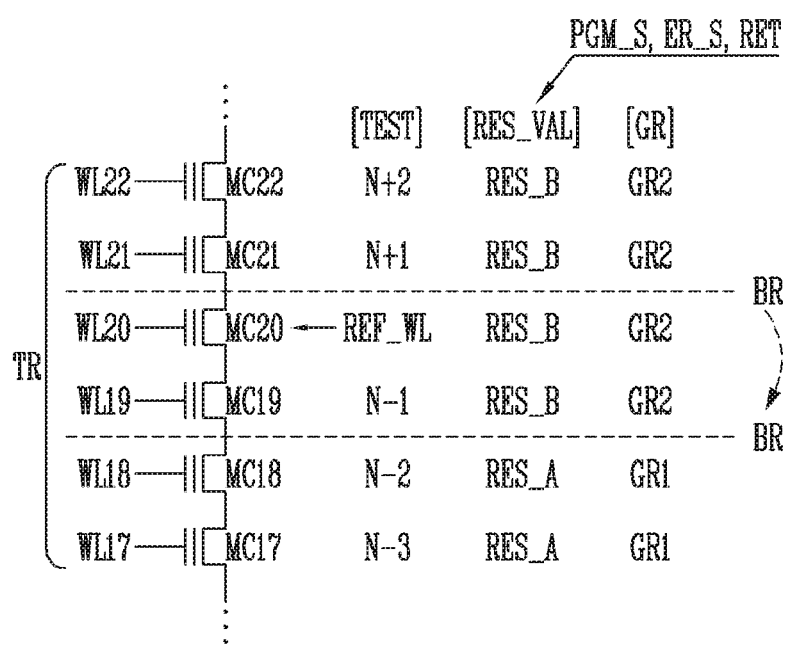

FIG. 8 is a diagram illustrating a test method of memory cells included in the test region and a group setting method.

Referring to FIG. 8, the test region TR may be set as a region including memory cells which are adjacent to the initially set boundary region BR and are included in different groups having similar structures. For example, memory cells and word lines connected thereto may be primarily divided into a plurality of groups according to a structural difference of the memory cells. However, memory cells adjacent to a boundary region with respect to which the memory cells are divided into different groups may have similar electrical characteristics even when the memory cells are included in different groups.

That is, some of the memory cells divided into different groups due to the structural difference may have an electrical characteristic more similar to that of memory cells included in another group instead of the group including the corresponding memory cells.

Therefore, the test region TR may be set as a region adjacent to the initially set boundary region BR. Although a case where the seventeenth to twenty-second word lines WL17 to WL22 are included in the test region TR is illustrated in FIG. 8, the test region TR may be differently set depending on memory devices, planes, and memory blocks. Alternatively, the test region TR may be differently formed depending on memory devices, be differently formed depending on planes, and be differently formed depending on memory blocks.

For the test operation, any one word line adjacent to the initially set boundary region BR may be set as a reference word line REF_WL, and a test voltage may be applied to word lines which are adjacent to the reference word line REF_WL and are included in the test region TR. For example, when the twentieth word line WL20 is set as the reference word line REF_WL, the test operation may be performed on memory cells respectively connected to an (N−1)th, (N−2)th, and (N−3)th word lines formed in a layer lower than that of the reference word line REF_WL and an (N+1)th and (N+2)th word lines formed in a layer higher than that of the reference word line REF_WL in the test region TR.

In a test operation, while word lines included in a selected test region TR are being selected one by one, a program speed of memory cells connected to the selected word line may be measured, an erase speed of the memory cells connected to the selected word line may be measured, and a period in which a threshold voltage is maintained after the memory cells connected to the selected word line are programmed, i.e., a retention characteristic may be measured. In a test mode, the above-described test operations may be all performed, or some of the test operations may be performed.

Initially set groups may be changed based on a result value RES_VAL of the test operation of the memory cells included in the test region TR. For example, the result value RES_VAL of the test operation may be a value obtained by reflecting a program speed PGM_S, an erase speed ER_S, and a retention characteristic RET of the memory cells; be a value obtained by reflecting any one characteristic among the program speed PGM_S, the erase speed ER_S, and the retention characteristic RET; or be a value obtained by reflecting some characteristics among the program speed PGM_S, the erase speed ER_S, and the retention characteristic RET. For example, when the result value RES_VAL of memory cells connected to the seventeenth and eighteenth word lines WL17 and WL18 is an Ath result value RES_A and the result value RES_VAL of memory cells connected to the nineteenth to twenty-second word lines WL19 to WL22 is a Bth result value RES_B, the boundary region BR may be changed to a region between the eighteenth and nineteenth word lines WL18 and WL19. When the boundary region BR of the first and second groups GR1 and GR2 is changed, the nineteenth and twentieth word lines WL19 and WL20 included in the first group GR1 before the test operation may be included in the second group GR2 after the test operation.

Therefore, the word line groups GR may be finally changed to the first group G1 including the seventeenth and eighteenth word lines WL17 and WL18 and the second group GR2 including the nineteenth to twenty-second word lines WL19 to WL22.

Figure 9:
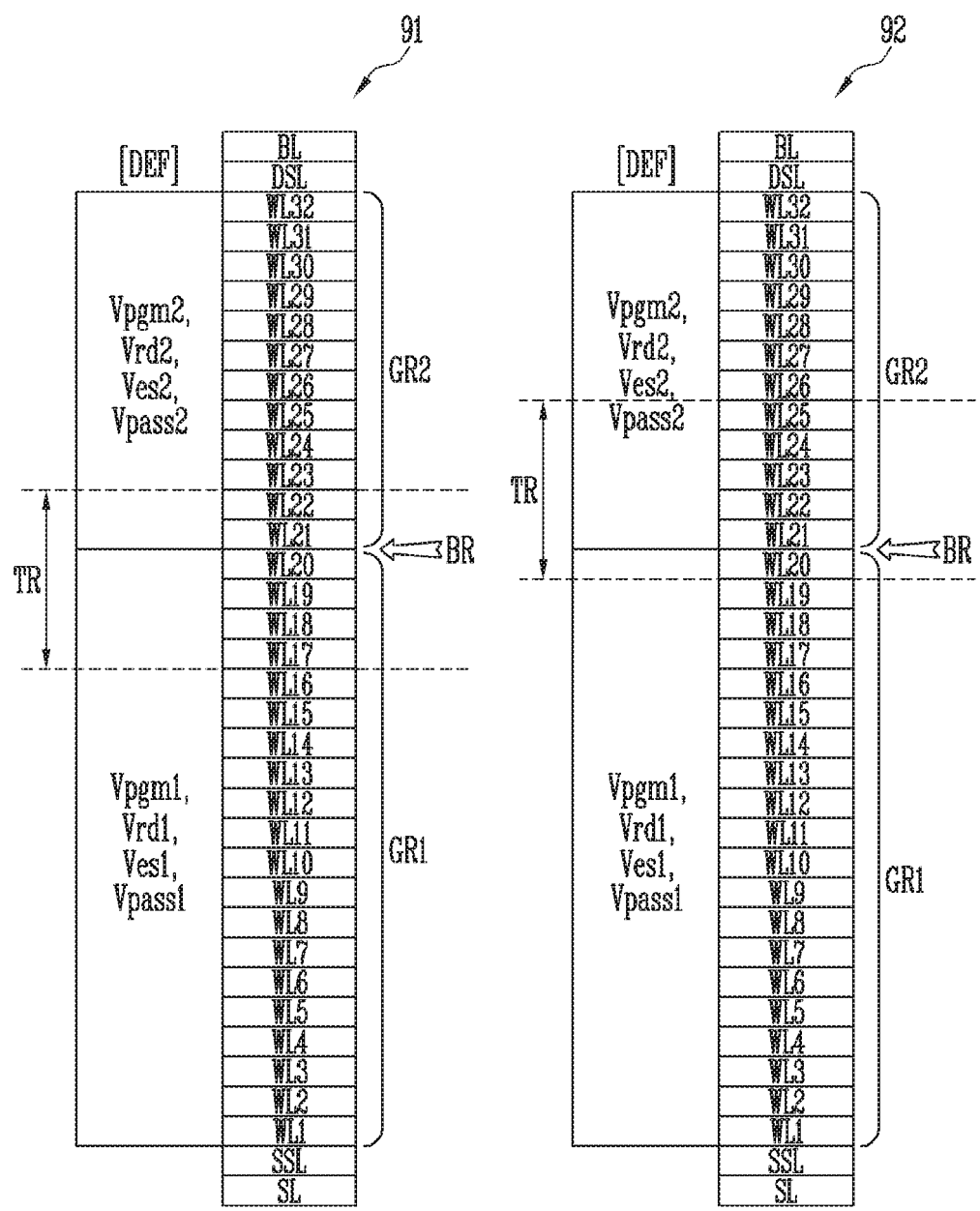

FIG. 9 is a diagram illustrating a setting method of the test region.

Referring to FIG. 9, although the same number of word lines are included in different memory blocks 91 and 92, electrical characteristics of memory cells may be different from each other due to a characteristic of a manufacturing process. The electrical characteristics of the memory cells may be primarily generated by a structural difference, but electrical characteristics may be similar to or different from each other between memory cells and word lines, which are adjacent to a boundary region set according to the structural difference.

The electrical characteristics may be checked through a test operation, but a time required to perform a test operation for testing all memory cells included in a memory block is increased. Therefore, in this embodiment, a partial region including a boundary region BR may be set as a test region TR, and the test operation is performed on only memory cells included in the test region TR. Accordingly, the time required to perform the test operation can be reduced.

The test region TR may be equally set with respect to all the memory blocks. However, the test region TR may be differently set depending on a position of a die including a memory device, i.e., a position at which the die is formed on a wafer. For example, in manufacturing the memory device, a physical difference may occur according to positions of dies formed on the wafer, and therefore, a difference in electrical characteristic may occur in the memory device. By considering the difference, a test region TR may be set between the seventeenth to twenty-second word lines WL17 to WL22 in a memory block 91 of some dies, and a test region TR may be set between the twentieth to twenty-fifth word lines WL20 to WL25 in a memory block 92 of other dies. The test regions TR shown in FIG. 9 are merely an embodiment, and may be changed depending on memory devices.

Figure 10:
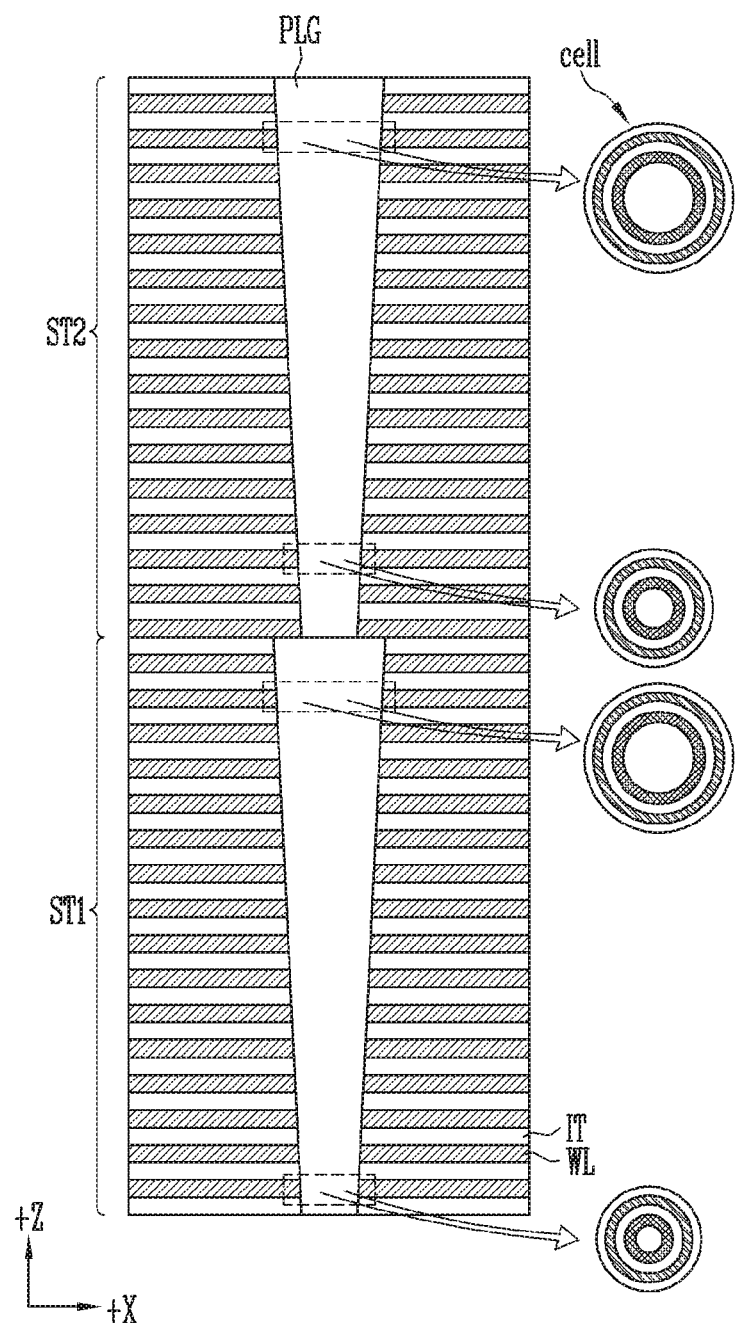
FIGS. 10 and 11 are diagrams illustrating a memory block having a multi-stack structure and a voltage setting method in accordance with a second embodiment of the present disclosure.
Figure 11:
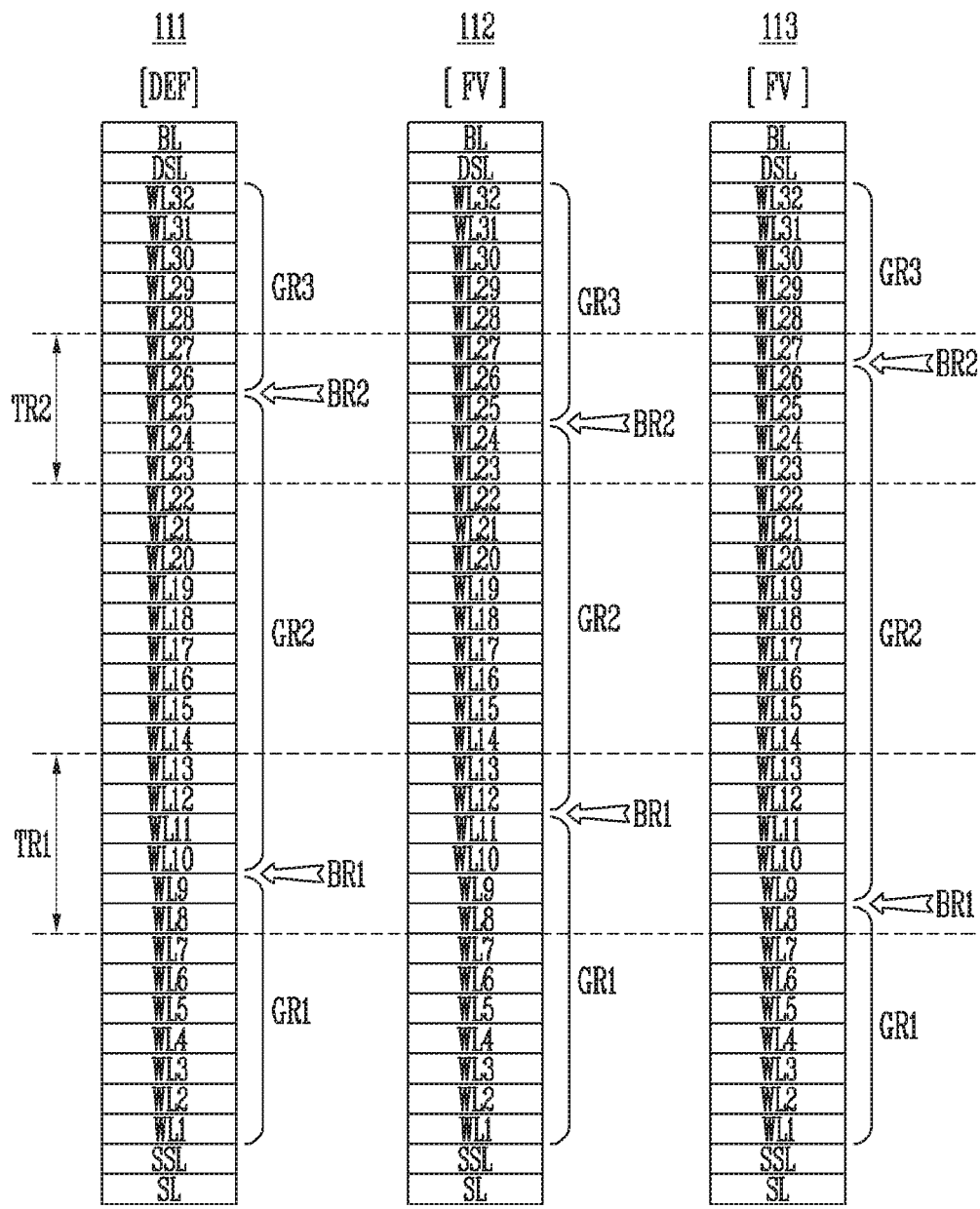

FIGS. 10 and 11 are diagrams illustrating a memory block having a multi-stack structure and a voltage setting method in accordance with a second embodiment of the present disclosure.

FIG. 10 is a diagram illustrating a section of a memory block formed in a multi-stack structure and a structure of memory cells.

Referring to FIG. 10, the multi-stack structure is a structure in which two or more single stack structures ST1 and ST2 are stacked to constitute one memory block. For example, a second stack ST2 may be stacked on the top of a first stack ST1, and memory cells formed in the first and second stacks ST1 and ST2 may constitute one memory string. In FIG. 10, a structure in which two stacks are stacked is illustrated as an embodiment, but three or more stacks may be stacked to constitute a multi-stack structure. This embodiment is not limited to any particular number of stacked stacks.

In the multi-stack structure, after the first stack ST1 is formed, the second stack ST is formed on the top of the first stack ST1. Therefore, the width of a plug PLG vertically penetrating word lines WL and interlayer insulating layers IT is not continuously narrowed as approach a lowermost portion from an uppermost portion of the plug PLG, and is discontinuously changed with respect to a boundary of the first and second stacks ST1 and ST2. For example, a width of a lowermost portion of a plug PLG included in the second stack ST2 is narrower than that of an uppermost portion of a plug PLG included in the first stack ST1. Therefore, in the multi-stack structure, even in the case of memory cells included in the same memory string, the memory cells may have a width discontinuously changed depending on heights thereof.

Referring to FIG. 11, as described above, in a memory block in which two or more regions having definitely different structures of memory cells exist in the same memory string, a plurality boundary regions BR1 and BR2 may be initially fixedly set. For example, a region between the ninth and tenth word lines WL9 and WL10 may be initially set as a first boundary region BR1, and a region between twenty-fifth and twenty-sixth word lines WL25 and WL25 may be initially set as a second boundary region BR2 (111). The word lines may be divided into first to third groups GR1 to GR3 by the initially set first and second boundary regions BR1 and BR2, and a default value DEF may be set according to each of the initially set first to third groups GR1 to GR3.

A first test region TR1 in which the first boundary region BR1 may be changed and a second test region TR2 in which the second boundary region BR2 may be changed may be set according to characteristics of a manufacturing process and positions of a die.

The first and second boundary regions BR1 and BR2 may be changed depending on memory blocks, based on a result of the test operation on memory cells included in the first and second test regions TR1 and TR2.

For example, when some memory cells formed at a lower portion of the second group GR2 have an electrical characteristic more similar to that of the memory cells included in the first group GR1 than that of the other memory cells included in the second group GR2 with respect to the initially set first boundary region BR1, the position of the first boundary region BR1 may be heightened (112). When some memory cells formed at an upper portion of the second group GR2 have an electrical characteristic more similar to that of the memory cells included in the third group GR3 than that of the other memory cells included in the second group GR2 with respect to the initially set second boundary region BR2, the position of the second boundary region BR2 may be lowered (112).

For example, when some memory cells formed at an upper portion of the first group GR1 have an electrical characteristic more similar to that of the memory cells included in the second group GR2 than that of the other memory cells included in the first group GR1 with respect to the initially set first boundary region BR1, the position of the first boundary region BR1 may be lowered (113). When some memory cells formed at a lower portion of the third group GR3 have an electrical characteristic more similar to that of the memory cells included in the second group GR2 than that of the other memory cells included in the third group GR3 with respect to the initially set second boundary region BR2, the position of the second boundary region BR2 may be heightened (113).

As described above, when the positions of the initially set first and second boundary regions BR1 and BR2 are changed (112 and 113), the boundary of each of the first to third groups GR1 to GR3 is changed, and hence word lines included in the first to third groups GR1 to GR3 are changed. Therefore, when the positions of the initially set first and second boundaries BR1 and BR2 are changed (112 and 113), the default value DEF may be changed to a final voltage value FV according to the word lines included in the first to third groups GR1 to GR3.

Figure 12:
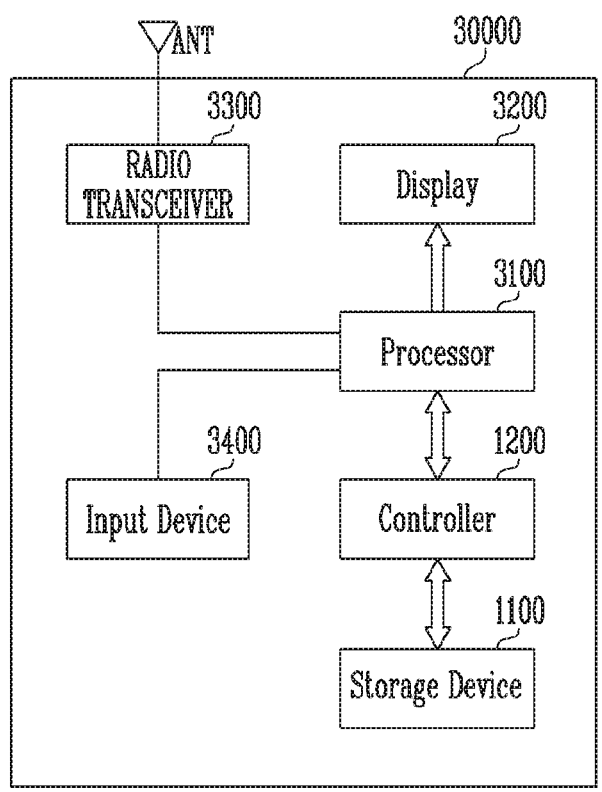
FIG. 12 is a diagram illustrating another embodiment of the memory system including the memory device shown in FIG. 2.

FIG. 12 is a diagram illustrating another embodiment of the memory system including the memory device shown in FIG. 2.

Referring to FIG. 12, the memory system 30000 may be implemented as a cellular phone, a smart phone, a tablet PC, a personal digital assistant (PDA), or a wireless communication device. The memory system 30000 may include a storage device 1100 and a controller 1200 capable of controlling an operation of the storage device 1100. The controller 1200 may control a data access operation of the storage device 1100, e.g., a program operation, an erase operation, a read operation, or the like under the control of a processor 3100.

Data programmed in the storage device 1100 may be output through a display 3200 under the control of the controller 1200.

A radio transceiver 3300 may transmit/receive radio signals through an antenna ANT. For example, the radio transceiver 3300 may change a radio signal received through the antenna ANT into a signal that can be processed by the processor 3100. Therefore, the processor 3100 may process a signal output from the radio transceiver 3300 and transmit the processed signal to the controller 1200 or the display 3200. The controller 1200 may transmit the signal processed by the processor 3100 to the storage device 1100. Also, the radio transceiver 3300 may change a signal output from the processor 3100 into a radio signal, and output the changed radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the controller 1200, data output from the radio transceiver 3300, or data output from the input device 3400 can be output through the display 3200.

In some embodiments, the controller 1200 capable of controlling an operation of the storage device 1100 may be implemented as a part of the processor 3100, or be implemented as a chip separate from the processor 3100.

Figure 13:
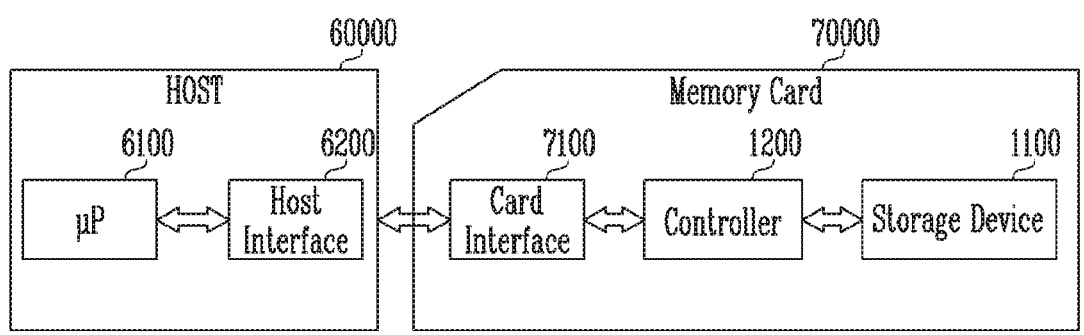
FIG. 13 is a diagram illustrating another embodiment of the memory system including the memory device shown in FIG. 2.

FIG. 13 is a diagram illustrating another embodiment of the memory system including the memory device shown in FIG. 2.

Referring to FIG. 13, the memory system 70000 may be implemented as a memory card or a smart card. The memory system 70000 may include a storage device 1100, a controller 1200, and a card interface 7100.

The controller 1200 may control data exchange between the storage device 1100 and the card interface 7100. In some embodiments, the card interface 7100 may be a secure digital (SD) card interface or a multi-media card (MMC) interface, but the present disclosure is not limited thereto.

The card interface 7100 may interface data exchange between the host 60000 and the controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellular phone, console video game hardware, or a digital set-top box, the host interface 6200 may perform data communication with the storage device 1100 through the card interface 7100 and the controller 1200 under the control of a microprocessor (μP) 6100.

In accordance with the present disclosure, an operating voltage can be changed depending on a structure and electrical characteristics of stacked memory cells, and thus the reliability of the memory device can be improved.

While the present disclosure has been shown and described with reference to certain embodiments thereof, it will be understood by those skilled in the art that various changes in form and detail may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or some of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device comprising:
a first stack including first memory cells that are vertically stacked on a substrate;
a second stack, over the first stack, including second memory cells, wherein a width of a memory cell located at a lowest portion of the second stack is narrower than a width of a memory cell located at a highest portion of the first stack;
word lines, wherein each of the first memory cells and the second memory cells is coupled to a corresponding word line;
a group controller configured to:
group the word lines into word line groups separated by a boundary region, which is set to an interlayer between the first stack and the second stack;
perform a test operation on memory cells adjacent to the boundary region by checking at least one of a program speed of the memory cells, an erase speed of the memory cells, and a period in which a threshold voltage is maintained after the memory cells are programmed;
determine whether to set a new interlayer as the boundary region based on a result of the test operation; and
when it is determined to set the new interlayer as the boundary region, determine the new interlayer and set the new interlayer as the boundary region before a program operation is performed; and
a voltage generator configured to store, in a voltage table, voltage values of operating voltages to be respectively applied to the word lines included in each of the word line groups,
wherein the group controller is configured to determine the voltage values depending on a position of the boundary region changed by the group controller.

2. The memory device of claim 1, wherein the group controller is configured to group the word line groups into at least two groups according to electrical characteristics of portions of the first and second memory cells adjacent to the boundary region.

3. The memory device of claim 1, wherein the group controller is configured to set a test region including portions of the first and second memory cells adjacent to the boundary region between the word line groups before the test operation is performed.

4. The memory device of claim 3, wherein the word lines adjacent to upper and lower portions with respect to the boundary region are included in the test region.

5. The memory device of claim 3, wherein the group controller is configured to change the position of the boundary region such that memory cells having similar electrical characteristics among the first and second memory cells adjacent to the boundary region included in the test region and connected to different word lines are included in the same group.

6. The memory device of claim 1, wherein the voltage values stored in the voltage table are level values of the operating voltages used in a program, read, or erase operation.

7. The memory device of claim 6, wherein the voltage values are respectively set with respect to the word line groups, based on the boundary region.

8. The memory device of claim 6, wherein the voltage generator is configured to:
primarily set the voltage values according to a structural difference of the first and second stacks; and
secondarily set the voltage values according to the result of the test operation.

9. The memory device of claim 8, wherein the voltage values changed depending on the result of the test operation are included in the voltage table.

10. A method for operating a memory device, the method comprising:
determining a first boundary region between a first stack and a second stack, wherein the second stack is over the first stack, and a width of a memory cell located at a lowest portion of the second stack is narrower than a width of a memory cell located at a highest portion of the first stack;
setting voltages corresponding to each of word line groups to a first voltage value;
performing a test operation on memory cells adjacent to the first boundary region by checking at least one of a program speed of the memory cells, an erase speed of the memory cells, and a period in which a threshold voltage is maintained after the memory cells are programmed;
changing the first boundary region to a second boundary region, depending on a result of the test operation;
changing the first voltage value to a second voltage value depending on the second boundary region; and
performing a program operation on a selected memory cell in one of the first or second stack using the voltages corresponding to the second voltage value.

11. The method of claim 10, wherein the second voltage value includes different final voltage values set with respect to the word line groups having different electrical characteristics of memory cells in the first and second stacks.

12. The method of claim 10, further comprising setting a test region with respect to the first boundary region before the first boundary region is changed.

13. The method of claim 12, wherein the test region includes a plurality of word lines sequentially adjacent to the first boundary region.

14. The method of claim 12, wherein the test region includes word lines adjacent to upper and lower portions of the first boundary region.

15. A method for operating a memory device, the method comprising:
setting a first boundary region dividing memory cells into first and second groups, wherein the first group is included in a first stack and the second group is included in a second stack that is over the first stack;
performing a test operation on memory cells adjacent to the first boundary region by checking at least one of a program speed of the memory cells, an erase speed of the memory cells, and a period in which a threshold voltage is maintained after the memory cells are programmed;
changing the first boundary region to a second boundary region by changing a position of the first boundary region, based on a result of the test operation; and
performing a program operation on the memory cells using voltages set according to the second boundary region.

16. The method of 15, wherein the first and second groups are reset such that memory cells having similar electrical characteristics are included in the same group based on the result of the test operation.

17. A memory device comprising:
a first stack including first memory cells that are vertically stacked on a substrate;
a second stack, over the first stack, including second memory cells, wherein a width of a memory cell located at a lowest portion of the second stack is narrower than a width of a memory cell located at a highest portion of the first stack;
a third stack, over the second stack, including third memory cells, wherein a width of a memory cell located at a lowest portion of the third stack is narrower than a width of a memory cell located at a highest portion of the second stack;
word lines, wherein each of the first memory cells, the second memory cells and the third memory cells is coupled to a corresponding word line;
a group controller configured to:
group the word lines into word line groups separated by a first boundary region between the first and second stacks and a second boundary region between the second and third stacks;
perform a test operation on memory cells adjacent to the first and second boundary regions by checking at least one of a program speed of the memory cells, an erase speed of the memory cells, and a period in which a threshold voltage is maintained after the memory cells are programmed; and
determine whether to set new boundary regions based on a result of the test operation; and
a voltage generator configured to store, in a voltage table, voltage values of operating voltages to be respectively applied to the word lines included in each of the word line groups,
wherein the group controller is configured to determine the voltage values depending on a position of the new boundary regions.

18. The memory device of claim 17, wherein the group controller is configured to set test regions including portions of the first and second memory cells adjacent to the first boundary region and portions of the second and third memory cells adjacent to the second boundary region before the test operation is performed.

19. The memory device of claim 18, wherein the group controller is configured to change positions of the first and second boundary regions such that memory cells having similar electrical characteristics among the first and second memory cells adjacent to the first boundary region are included in the same group, and memory cells having similar electrical characteristics among the second and third memory cells adjacent to the second boundary region are included in the same group.

* * * * *